(12) United States Patent
Takeuchi

(10) Patent No.: US 9,050,624 B2
(45) Date of Patent: Jun. 9, 2015

(54) FILM-FORMING COMPOSITION FOR IMPRINTING, METHOD OF MANUFACTURING A STRUCTURE, AND STRUCTURE

(75) Inventor: Yoshiyuki Takeuchi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 111 days.

(21) Appl. No.: 13/168,697

(22) Filed: Jun. 24, 2011

(65) Prior Publication Data

US 2011/0254191 A1 Oct. 20, 2011

Related U.S. Application Data

(62) Division of application No. 12/352,729, filed on Jan. 13, 2009, now abandoned.

(30) Foreign Application Priority Data

Jan. 18, 2008 (JP) .................................. 2008-008968

(51) Int. Cl.
| | |
|---|---|
| *G03F 7/00* | (2006.01) |
| *B05D 3/12* | (2006.01) |
| *B82Y 10/00* | (2011.01) |
| *B05C 11/02* | (2006.01) |
| *B82Y 40/00* | (2011.01) |

(52) U.S. Cl.
CPC .................. *B05D 3/12* (2013.01); *B05C 11/028* (2013.01); *B82Y 10/00* (2013.01); *B82Y 40/00* (2013.01); *G03F 7/0002* (2013.01); *Y10T 428/24802* (2015.01)

(58) Field of Classification Search
None
See application file for complete search history.

(56) References Cited

U.S. PATENT DOCUMENTS

| | | | |
|---|---|---|---|
| 4,373,061 A | 2/1983 | Ching | |
| 5,772,905 A | 6/1998 | Chou | |
| 5,998,509 A * | 12/1999 | Hayase et al. | ................ 523/425 |

(Continued)

FOREIGN PATENT DOCUMENTS

| | | |
|---|---|---|
| JP | 2003-100609 A | 4/2003 |
| JP | 2006-143835 | 6/2006 |

(Continued)

OTHER PUBLICATIONS

Notice of Reasons for Rejection issued in Japanese Patent Application No. 2008-008968 on May 29, 2012.
Notice of Reasons for Rejection issued in JP Application No. 2008-008968, mailed Dec. 18, 2012.

*Primary Examiner* — Timothy Meeks
*Assistant Examiner* — Michael P Rodriguez
(74) *Attorney, Agent, or Firm* — Knobbe Martens Olson & Bear LLP

(57) ABSTRACT

A film-forming composition for imprinting that enables a structure to be obtained after coating the composition on a substrate and pressing a mold thereto with low compression pressure, a method of manufacturing a structure using the film-forming composition for imprinting, and a structure obtained thereby. The film-forming composition for imprinting according to the present invention contains a resin and an organic solvent, in which the organic solvent includes a particular solvent having a boiling point of 100 to 200° C. at ambient pressure. When the structure is manufactured, the film-forming composition for imprinting according to the present invention is coated on a substrate to form a resin layer, and after a mold is pressed against the resin layer, the mold is released from the resin layer.

2 Claims, 2 Drawing Sheets

(56) References Cited

U.S. PATENT DOCUMENTS 6,334,960 B1 * 1/2002 Willson et al. .................. 216/52
2007/0134916 A1 6/2007 Iwabuchi et al.
2009/0256287 A1 * 10/2009 Fu et al. ........................ 264/447

FOREIGN PATENT DOCUMENTS

| JP | 2007-258669 | 10/2007 |
| JP | 2008-194894 | 8/2008 |
| JP | 2009007515 A | 1/2009 |

* cited by examiner

FILM-FORMING COMPOSITION FOR IMPRINTING, METHOD OF MANUFACTURING A STRUCTURE, AND STRUCTURE

This application is a divisional of U.S. patent application Ser. No. 12/352,729, (abandoned), filed Jan. 13, 2009, which claims priority under 35 U.S.C. §119(a)-(e) to Japanese Patent Application No. 2008-008968, filed on 18 Jan. 2008, the content of which is incorporated herein by reference.

BACKGROUND OF THE INVENTION

1. Field of the Invention

The present invention relates to: a film-forming composition for imprinting, for use in forming a structure by coating on a substrate, and pressing a mold thereto; and a method of manufacturing a structure using the film-forming composition for imprinting, and a structure obtained thereby.

2. Related Art

In the past, an imprinting technique was proposed as one of the techniques for forming a fine pattern on a substrate (see, Patent Document 1). In this imprinting technique, a fine transferred pattern is obtained fundamentally, by pressing a mold, which has a predetermined pattern formed thereon, against a substrate having a resin layer formed on its surface, and thus transferring the shape of the mold to the resin layer. The patterned resin layer obtained in this manner is utilized as, for example, a resist for use in subjecting a substrate to an etching processing. Herein, the patterned resin layer obtained using an imprinting technique in this manner is generally referred to as "structure".

Conventionally, a thermoplastic resin or a photocurable resin has been used for resin layers, and "thermal imprinting technique" and "photoimprinting technique" have been well known, respectively, as available techniques. In the thermal imprinting technique: the resin is softened by heating beforehand; then a mold is pressed against the resin layer; the resin layer is cooled in this state to cure the resin; and thereafter the mold is released to form a transferred pattern. Meanwhile, in the photoimprinting technique: a mold is pressed against a resin layer; light is irradiated on the resin layer in this state to cure the resin; and thereafter the mold is released to form a transferred pattern.

In addition, a technique in which a siloxane resin is used for a resin layer, and a transferred pattern is obtained at room temperatures has been proposed in recent years, the technique having been recognized as "room-temperature imprinting technique" (see, Patent Document 2). In this room-temperature imprinting technique, a mold is pressed against a resin layer, and thereafter the mold is released to form a transferred pattern. Since this room-temperature imprinting technique necessitates neither a heating step nor a light irradiation step as in the conventional thermal imprinting techniques and photoimprinting techniques, it is advantageous from the perspective of achieving a high throughput. Furthermore, since a siloxane resin is used for the resin layer, the obtained structure can be utilized not only as a resist for etching, but also as a miniature lens in CMOS sensors, and the like.

Patent Document 1: U.S. Pat. No. 5,772,905.
Patent Document 2: Japanese Unexamined Patent Application Publication No. 2003-100609.

SUMMARY OF THE INVENTION

Regarding the imprinting techniques described above, it is preferred that a low compression pressure is applied in pressing a mold against a resin layer such that the shape of the mold can be transferred to the resin layer in an easy and accurate manner. In particular, since the room-temperature imprinting technique necessitates a higher compression pressure to be applied in pressing a mold against the resin layer in comparison with the thermal imprinting techniques and the photoimprinting techniques, lowering of the compression pressure is particularly demanded.

The present invention was made in view of such conventional problems, and an object of the invention is to provide a film-forming composition for imprinting that enables a structure to be obtained after coating the composition on a substrate and pressing a mold thereto with low compression pressure, a method of manufacturing a structure using the film-forming composition for imprinting, and a structure obtained thereby.

The present inventors elaborately pursued research in order to achieve the object described above. Consequently, it was found that the aforementioned problems can be solved by including in a film-forming composition for imprinting a particular solvent having a boiling point within a specified range at ambient pressure. Accordingly, the present invention was accomplished. Specifically, the present invention provides the following.

A first aspect of the present invention provides a film-forming composition for imprinting, for use in forming a structure by coating on a substrate, and pressing a mold thereto, the composition including a resin and an organic solvent, in which the organic solvent includes a particular solvent having a boiling point of 100 to 200° C. at ambient pressure.

A second aspect of the present invention provides a method of manufacturing a structure including the steps of: coating the film-forming composition for imprinting according to the present invention on a substrate to form a resin layer; pressing a mold against the resin layer; and releasing the mold from the resin layer.

A third aspect of the present invention provides a structure obtained by the method of manufacturing a structure according to the present invention.

According to the present invention, to obtain a desired structure is enabled when a film-forming composition for imprinting is coated on a substrate and a mold is pressed thereto, even though a low compression pressure is applied.

DETAILED DESCRIPTION OF THE PREFERRED EMBODIMENT

Film-Forming Composition for Imprinting

Figure 1A:
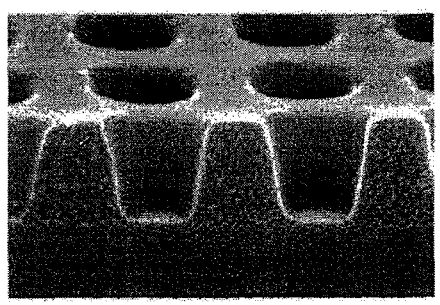
FIG. 1A shows a view illustrating an SEM image of a structure obtained using a film-forming composition for imprinting of Example 1 when a mold is pressed at a compression pressure of 20 MPa.

The film-forming composition for imprinting according to the present invention contains at least a resin and an organic solvent, and is used for forming a structure by coating on a substrate, and pressing a mold thereto. This film-forming composition for imprinting may be one used in any of photoimprinting techniques and room-temperature imprinting techniques. However, since the room-temperature imprinting technique generally requires a higher compression pressure in pressing a mold against a resin layer, the effects exhibited by using the film-forming composition for imprinting according to the present invention are more marked in the room-temperature imprinting techniques. Therefore, the film-forming composition for imprinting used in a room-temperature imprinting technique will hereinafter be primarily explained.

Resin

The resin included in the film-forming composition for imprinting according to the present invention may vary depending on use of the composition either in a photoimprinting technique or in a room-temperature imprinting technique. However, when it is used in the room-temperature imprinting technique, a siloxane resin may be included. The siloxane resin is exemplified by, for example, a hydrolysate and/or a partial condensate of at least a silane compound represented by the following formula (1):

$$R_nSiX_{4-n} \quad (1)$$

Wherein, R represents a hydrogen atom or an organic group having 1 to 20 carbon atoms, and plural Rs may be the same or different. Examples of the organic group include alkyl groups such as a methyl group, an ethyl group, and a propyl group; alkenyl groups such as a vinyl group, an allyl group, and a propenyl group; aryl groups such as a phenyl group, and a tolyl group; aralkyl groups such as a benzyl group, and a phenylethyl group; and the like, and these may be substituted with a hydroxyl group, an alkoxy group or the like.

Moreover, in the above formula (1), X represents a hydrolyzable group. Examples of the hydrolyzable group include alkoxy groups such as a methoxy group, an ethoxy group, a propoxy group, an isopropoxy group, and a butoxy group; alkenoxy groups such as a vinyloxy group and a 2-propenoxy group; acyloxy groups such as a phenoxy group and an acetoxy group; oxime groups such as a butanoxime group; amino groups; and the like. Among these, alkoxy groups having 1 to 5 carbon atoms are preferable, and a methoxy group, an ethoxy group, an isopropoxy group, and a butoxy group are preferable in view of ease of control of hydrolysis and condensation. Additionally, in the above formula (1), n represents an integer of 0 to 2.

In production of the siloxane resin, among the silane compounds represented by the above formula (1), at least the compound in which n is 0 is preferably used. Accordingly, the mechanical strength of the resulting structure may be further increased. Also, in the case where n is 1 or 2, the compound in which R is an organic group is preferably used.

Specific examples of the silane compound represented by the above formula (1) include trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, fluorotriphenoxysilane, tetramethoxysilane, tetraethoxysilane, tetra-n-propoxysilane, tetraisopropoxysilane, tetra-n-butoxysilane, tetra-sec-butoxysilane, tetra-tert-butoxysilane, tetraphenoxysilane, methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, γ-trifluoropropyltriethoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropylditert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, divinyldimethoxysilane, di-γ-aminopropyldimethoxysilane, di-γ-aminopropyldiethoxysilane, di-γ-glycidoxypropyldimethoxysilane, di-γ-glycidoxypropyldiethoxysilane, di-γ-trifluoropropyldimethoxysilane, di-γ-trifluoropropyldiethoxysilane, and the like. These may be used alone, or in combinations of two or more.

Preferable examples among the silane compounds represented by the above formula (1) include tetramethoxysilane, tetraethoxysilane, tetra-n-propoxysilane, tetraisopropoxysilane, tetraphenoxysilane, methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, trimethylmonomethoxysilane, trimethylmonoethoxysilane, triethylmonomethoxysilane, triethylmonoethoxysilane, triphenylmonomethoxysilane, triphenylmonoethoxysilane, and the like.

The mass-average molecular weight of the siloxane resin is not particularly limited, but a low-molecular weight siloxane resin having a mass-average molecular weight (based on polystyrene standard by way of GPC, the same is applied herein) of 300 to 5000 is preferably included. By including such a low-molecular weight siloxane resin in the film-forming composition for imprinting, the mold can be pressed into the resin layer at a lower compression pressure as compared with the case in which no such resin is included. This low-molecular weight siloxane resin has a mass-average molecular weight of more preferably 300 to 3,000.

The proportion of the low-molecular weight siloxane resin in the entire siloxane resin is preferably no less than 30% by mass, more preferably no less than 50% by mass, and particularly preferably 100% by mass.

Organic Solvent

Specific examples of the organic solvent included in the film-forming composition for imprinting according to the present invention include: alcohols such as methanol, ethanol, propanol, and n-butanol; polyhydric alcohols such as ethylene glycol, diethylene glycol, propylene glycol, and dipropylene glycol; ketones such as acetone, methyl ethyl ketone, cyclohexanone, methyl-n-amyl ketone, methylisoamyl ketone, and 2-heptanone; compounds having an ester bond, such as ethylene glycol monoacetate, diethylene glycol monoacetate, propylene glycol monoacetate, and dipropylene glycol monoacetate; derivatives of polyhydric alcohols, such as compounds having an ether bond including monoalkyl ethers (e.g., monomethyl ethers, monoethyl ethers, monopropyl ethers and monobutyl ethers) and monophenyl ethers of the above polyhydric alcohols or the above compounds having an ester bond; cyclic ethers such as dioxane; esters such as methyl lactate, ethyl lactate, methyl acetate, ethyl acetate, butyl acetate, methyl pyruvate, ethyl pyruvate, methyl methoxypropionate, and ethyl ethoxypropionate; aromatic organic solvents such as anisole, ethylbenzyl ether, cresylmethyl ether, diphenyl ether, dibenzyl ether, phenetol, butylphenyl ether, ethylbenzene, diethylbenzene, amylbenzene, isopropylbenzene, toluene, xylene, cymene, and mesitylene; and the like. These may be used alone or in combinations of two or more.

Particularly, at least a particular solvent having a boiling point of 100 to 200° C. at ambient pressure is included in the film-forming composition for imprinting according to the present invention. By including such a particular solvent in the film-forming composition for imprinting, a mold can be pressed into the resin layer at a lower compression pressure as compared with the case in which no such solvent is included. Among such particular solvents, preferred are n-butanol (boiling point: 117° C.), propylene glycol monomethyl ether (boiling point: 118° C.), propylene glycol monomethyl ether acetate (boiling point: 146° C.), propylene glycol monopropyl ether (boiling point: 150° C.), ethyl lactate (boiling point: 154° C.), 3-methoxybutyl acetate (boiling point: 171° C.), diethylene glycol diethyl ether (boiling point: 185° C.), and the like. More preferably, this particular solvent has a boiling point of 110 to 190° C.

The proportion of the particular solvent in the entire organic solvent is preferably no less than 30% by mass, more preferably no less than 50% by mass, and particularly preferably no less than 70% by mass.

The content of the organic solvent is not particularly limited, and when a siloxane resin is used as the resin, the concentration of the siloxane resin ($SiO_2$ equivalent) is preferably 0.1 to 40% by mass, and more preferably 0.5 to 30% by mass.

Other Components

The film-forming composition for imprinting according to the present invention may include a surfactant if necessary. By including a surfactant, favorable transferring properties of the shape of the mold are achieved. The surfactant is not particularly limited, and any known component may be used.

When the film-forming composition for imprinting according to the present invention is used in photoimprinting techniques, a photopolymerization initiator and the like may be included in addition to the resin and the organic solvent.

Method of Manufacturing a Structure

The method of manufacturing a structure according to the present invention includes the steps of: coating the film-forming composition for imprinting according to the present invention on a substrate to form a resin layer; pressing a mold against the resin layer; and releasing the mold from the resin layer. In particular, the film-forming composition for imprinting includes at least a particular solvent having a boiling point of 100 to 200° C. at ambient pressure.

First, the film-forming composition for imprinting according to the present invention is coated on a substrate by a spin coating method or the like to form a resin layer. The film thickness of the resin layer may vary depending on the type of structure to be manufactured, and for example, the film thickness may be approximately 10 nm to 5 μm.

Also, the substrate is not particularly limited, and for example, a substrate consisting of a metal such as silicon, copper, chromium, iron or aluminum, a glass substrate, or a substrate having a certain wiring pattern formed thereon may be used. Alternatively, a substrate having an organic layer or an inorganic layer formed thereon may also be used.

Next, a mold having a predetermined shape is pressed against the resin layer formed on the substrate, and thus the shape of the mold is transferred to the resin layer. In this process, the mold can be pressed in at a low compression pressure since the film-forming composition for imprinting includes the particular solvent having a boiling point of 100 to 200° C. at ambient pressure. In this step, it is not necessary to press the mold until the leading edge of the protruding part of the mold reaches the lowermost part of the resin layer. In other words, the resin layer without the mold shape being transferred thereto may remain as a residual film below the resin layer with the mold shape being transferred thereto. In this case, a structure will be formed at the upper part of the residual film of the resin layer.

When the film-forming composition for imprinting according to the present invention is used in room-temperature imprinting techniques, the compression pressure of the mold may be about 1 to 50 MPa. To the contrary, in conventional room-temperature imprinting techniques, a compression pressure of no less than 50 MPa has been usually required, particularly when a siloxane resin is used. In addition, the pressing time may be about 10 to 120 sec in the present invention although it may vary depending on the thickness of the resin layer.

When the film-forming composition for imprinting according to the present invention is used in the room-temperature imprinting techniques, the shape of the mold transferred to the resin layer can be maintained more favorably by pressing for a predetermined time in such a state with the mold being pressed thereto. Particularly, this effect is prominent when the siloxane resin is used.

Moreover, when the film-forming composition for imprinting according to the present invention is used in the photoimprinting techniques, light is irradiated on the resin layer having the mold pressed thereto to harden the resin layer and thus form the shape of the mold.

Thereafter, the mold is released from the resin layer. As a result, a structure with the shape of the mold being transferred thereto is formed on the substrate.

It is also possible to further harden the aforementioned resin layer with the mold shape being transferred thereto by heating and/or baking. In addition, it is also possible to allow the resin layer with the mold shape being transferred thereto to flow by altering the heating temperature or the like, whereby the shape may be changed to another. This heating and/or baking may be carried out prior to releasing the mold.

In such a manner, the structure with the mold shape being transferred thereto can be formed on a substrate. Thus formed structure can be utilized not only as a resist for use in etching processing of a substrate, but also as a miniature lens in CMOS sensors, and the like. Accordingly, in the present invention, structures having a variety of shapes can be manufactured by changing the shape of the mold.

EXAMPLES

Herein below, the present invention is described in more detail with reference to Examples, but it is not to be construed as being limited thereto.

Example 1

Using a silsesquioxane resin represented by the following formula (2) (mass-average molecular weight: 1,200, n:m=1:1 (molar ratio)), a film-forming composition for imprinting was obtained by adjusting with propylene glycol monopropyl ether (boiling point: 150° C.) so as to give a resin concentration ($SiO_2$ equivalent) of 3% by mass.

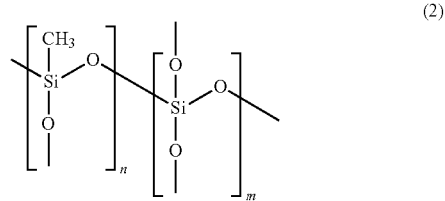

Examples 2 to 4, Comparative Examples 1 and 2

A film-forming composition for imprinting was obtained in a similar manner to Example 1 except that the organic solvent shown in Table 1 was used in place of propylene glycol monopropyl ether.

Example 5

Using a silsesquioxane resin composed of the constituent unit represented by the following formula (3) (mass-average molecular weight: 6,500), a film-forming composition for imprinting was obtained by adjusting with propylene glycol monopropyl ether (boiling point: 150° C.) so as to give a resin concentration ($SiO_2$ equivalent) of 3% by mass.

Examples 6 and 7, Comparative Examples 3 and 4

A film-forming composition for imprinting was obtained in a similar manner to Example 5 except that the organic solvent shown in Table 2 was used in place of propylene glycol monopropyl ether.
Evaluation 1

The film-forming compositions for imprinting of Examples 1 to 7, and Comparative Examples 1 to 4 were coated on the surface of a silicon substrate by a spin coating method to provide a resin layer having a film thickness of 100 to 150 nm. Without drying and curing the resin layer, a mold (male mold having a dot pattern, dot diameter: 150 nm, dot height: 300 nm) was pressed against the resin layer at a compression pressure of 20 MPa (load of 2 kN), and at room temperature (25° C.) for 60 sec using a nanoimprinter NM-0401 (manufactured by Meisyo Kiko Co., Ltd.). Thereafter, the mold was released to form a pattern structure on the substrate.

Figure 1B:
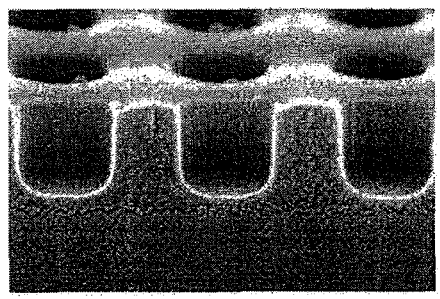
FIG. 1B shows a view illustrating an SEM image of a structure obtained using a film-forming composition for imprinting of Example 2 when a mold is pressed at a compression pressure of 20 MPa.
Figure 1C:
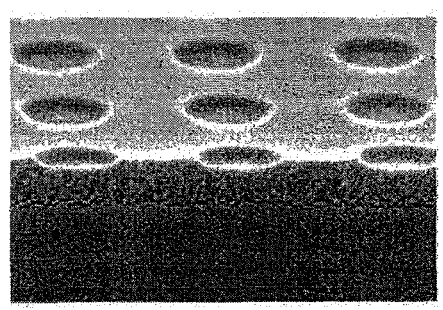
FIG. 1C shows a view illustrating an SEM image of a structure obtained using a film-forming composition for imprinting of Comparative Example 2 when a mold is pressed at a compression pressure of 20 MPa.
Figure 2A:
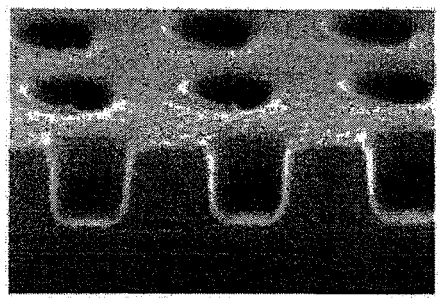
FIG. 2A shows a view illustrating an SEM image of a structure obtained using a film-forming composition for imprinting of Example 5 when a mold is pressed at a compression pressure of 20 MPa.
Figure 2B:
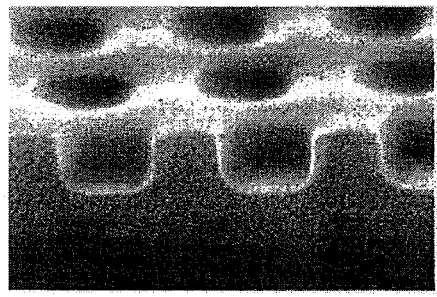
FIG. 2B shows a view illustrating an SEM image of a structure obtained using a film-forming composition for imprinting of Example 6 when a mold is pressed at a compression pressure of 20 MPa.
Figure 2C:
FIG. 2C shows a view illustrating an SEM image of a structure obtained using a film-forming composition for imprinting of Comparative Example 4 when a mold is pressed at a compression pressure of 20 MPa.

Thus obtained structure was observed with a scanning electron microscope (SEM). Consequently, the pattern was replicated with high accuracy on the substrate when the film-forming compositions for imprinting of Examples 1 to 7 were used. SEM images of the structures obtained when the film-forming compositions for imprinting of Examples 1 and 2, and Comparative Example 2 were used are shown in FIG. 1A to FIG. 1C, respectively. Moreover, SEM images of the structures obtained when the film-forming compositions for imprinting of Examples 5 and 6, and Comparative Example 4 were used are shown in FIG. 2A to FIG. 2C, respectively.

Furthermore, the residual film rates exhibited when the film-forming compositions for imprinting of Examples 1 to 7, and Comparative Examples 1 to 4 were used are shown in Tables 1 and 2. Herein, the residual film rate means a ratio of the film thickness of the residual film resin layer at a part between the substrate and a depression left by a protruding part of the mold (the part where the mold shape was not transferred), to the original film thickness of the resin layer. For example, when the mold is pressed into a resin layer having a film thickness of 100 nm to a depth of 70 nm (70%), a residual film rate of 30% is exhibited. The values in Table 1 show relative values when the residual film rate in Comparative Example 2 was assumed to be 100, while the values in Table 2 show relative values when the residual film rate in Comparative Example 4 was assumed to be 100.

TABLE 1

| | Organic solvent | Residual film rate |
|---|---|---|
| Example 1 | propylene glycol monopropyl ether (boiling point: 150° C.) | 1.85 |
| Example 2 | propylene glycol monomethyl ether acetate (boiling point: 146° C.) | 9.75 |
| Example 3 | n-butanol (boiling point: 117° C.) | 33.2 |
| Example 4 | propylene glycol monomethyl ether acetate (boiling point: 146° C.): acetone (boiling point: 57° C.) = 1:1 (mass ratio) | 13.4 |
| Comparative Example 1 | isopropyl alcohol (boiling point: 82° C.) | 72 |
| Comparative Example 2 | acetone (boiling point: 57° C.) | 100 |

TABLE 2

| | Organic solvent | Residual film rate |
|---|---|---|
| Example 5 | propylene glycol monopropyl ether (boiling point: 150° C.) | 12.4 |
| Example 6 | propylene glycol monomethyl ether acetate (boiling point: 146° C.) | 29.8 |
| Example 7 | n-butanol (boiling point: 117° C.) | 59.2 |
| Comparative Example 3 | isopropyl alcohol (boiling point: 82° C.) | 92.3 |
| Comparative Example 4 | acetone (boiling point: 57° C.) | 100 |

As is seen from Tables 1 and 2, a lower residual film rate was found when an organic solvent having a higher boiling point was employed. In particular, when the film-forming compositions for imprinting of Examples 1 to 7 were used, significantly lower residual film rates were respectively achieved compared to cases in which the film-forming compositions for imprinting of Comparative Examples 1 to 4 were used. In addition, when a low-molecular weight siloxane resin (mass-average molecular weight: 1200) was used as in Examples 1 to 4, a lower residual film rate was achieved compared to the case in which the siloxane resin (mass-average molecular weight: 6,500) was used as in Examples 5 to 7.

Evaluation 2

The film-forming composition for imprinting of Example 1 was coated on the surface of a silicon substrate by a spin coating method to provide a resin layer having a film thickness of 150 nm. Without drying and curing the resin layer, a mold (male mold having a dot pattern, dot diameter: 150 nm, dot height: 300 nm) was pressed against the resin layer at a compression pressure of 1 MPa (load of 100 N), and at room temperature (25° C.) for 60 sec using a nanoimprinter NM-0401 (manufactured by Meisyo Kiko Co., Ltd.). Thereafter, the mold was released to form a pattern structure on the substrate.

Figure 3:
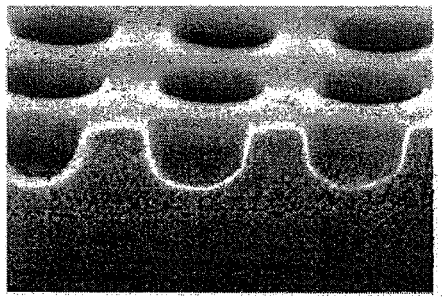
FIG. 3 shows a view illustrating an SEM image of a structure obtained using a film-forming composition for imprinting of Example 1 when a mold is pressed at a compression pressure of 1 MPa.

The obtained structure was observed with a scanning electron microscope (SEM). Consequently, as shown in FIG. 3, the pattern was replicated with high accuracy on the substrate. In particular, a residual film rate of 30% could be achieved at a low pressure of 1 MPa which is equivalent to the pressure in photoimprinting techniques.

What is claimed is:

1. A method of manufacturing a structure comprising:
   coating a film-forming composition for imprinting on a substrate to form a resin layer;
   pressing a mold against the resin layer;
   curing the resin layer without performing light irradiation or heating; and
   releasing the mold from the resin layer, wherein
   the film-forming composition for imprinting comprises
   a silsesquioxane resin that is a partial condensate of at least one silane compound represented by the following formula (1):

$$R_nSiX_{4-n} \quad (1)$$

wherein R represents a hydrogen atom or an alkyl group, aryl group or aralkyl group having 1 to 20 carbon atoms that may be substituted by an alkoxy group, each R may be the same or different in a case of R being present in plurality; X represents a hydrolyzable group; and n represents an integer of 0 to 2, wherein said silsesquioxane resin has a mass-average molecular weight of 300 to 5,000; and
   an organic solvent, wherein the organic solvent comprises no less than 50% by mass of a solvent selected from the group consisting of propylene glycol monopropyl ether, propylene glycol monomethyl ether acetate and n-butanol.

2. The method of manufacturing a structure according to claim 1 wherein the organic solvent comprises no less than 70% by mass of a solvent selected from the group consisting of propylene glycol monopropyl ether, propylene glycol monomethyl ether acetate and n-butanol.

* * * * *